(12) United States Patent
Tsai et al.

(10) Patent No.: US 10,290,363 B2
(45) Date of Patent: May 14, 2019

(54) NON-VOLATILE MEMORY DEVICE AND ERROR COMPENSATION METHOD FOR VERIFYING THE SAME

(71) Applicant: Powerchip Technology Corporation, Hsinchu (TW)

(72) Inventors: Ming-Chang Tsai, Hsinchu County (TW); Chun-Yi Tu, Hsinchu County (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/904,447

(22) Filed: Feb. 26, 2018

(65) Prior Publication Data

US 2019/0115092 A1    Apr. 18, 2019

(30) Foreign Application Priority Data

Oct. 18, 2017   (TW) .............................. 106135728 A

(51) Int. Cl.
*G11C 29/52*   (2006.01)
*G11C 29/12*   (2006.01)

(52) U.S. Cl.
CPC .......... *G11C 29/52* (2013.01); *G11C 29/1201* (2013.01); *G11C 29/12005* (2013.01); *G11C 2029/1202* (2013.01)

(58) Field of Classification Search
CPC .............. G11C 29/52; G11C 29/12005; G11C 29/1201; G11C 2029/1202
See application file for complete search history.

(56) References Cited

U.S. PATENT DOCUMENTS

| | | | |
|---|---|---|---|
| 7,170,784 B2 | 1/2007 | Cernea et al. | |
| 9,047,962 B2 | 6/2015 | Ishii | |
| 9,952,944 B1* | 4/2018 | Alrod | G11C 16/08 |
| 2004/0057287 A1 | 3/2004 | Cernea et al. | |
| 2012/0155186 A1 | 6/2012 | Chokan et al. | |
| 2015/0124526 A1 | 5/2015 | Kim | |
| 2015/0160859 A1 | 6/2015 | Kim et al. | |

OTHER PUBLICATIONS

"Office Action of Taiwan Counterpart Application," dated Feb. 12, 2018, p. 1-p. 5, in which the listed references were cited.

* cited by examiner

*Primary Examiner* — David Lam
(74) *Attorney, Agent, or Firm* — JCIPRNET

(57) ABSTRACT

A non-volatile memory device and an error compensation method for verifying the same are provided. The non-volatile memory device includes a memory block, a word line driver, a bit line circuit and a controller. The memory block includes multiple memory cells. After a first programming process and a first verification process are performed on the memory cells, the controller performs reverse reading to the control terminals of the memory cells, applies a preset voltage to the control terminals of the memory cells according to preset programming data by using the word line driver, reads data from the memory cells by using the bit line circuit, and determines whether the data of each memory cell is normal according to the data read from the memory cells. When the data of specific memory cells is not normal, the controller performs a second programming process to the specific memory cells.

10 Claims, 4 Drawing Sheets

| First buffer 225 | | | | | | | | | Mask buffer 226 | | | | | | | |
|---|---|---|---|---|---|---|---|---|---|---|---|---|---|---|---|---|
| | b0 | b1 | b2 | b3 | b4 | b5 | b6 | b7 | | b0 | b1 | b2 | b3 | b4 | b5 | b6 | b7 |
| (0) | – | – | – | – | – | – | – | – | (0) | – | – | – | – | – | – | – | – |
| (1) | 0 | 0 | 0 | 0 | 0 | 1 | 1 | 0 | (1) | 0 | 0 | 0 | 0 | 0 | 1 | 1 | 0 |
| (2) | 0 | 0 | 0 | 0 | 0 | 1 | 1 | 0 | (2) | 0 | 0 | 0 | 0 | 0 | 1 | 1 | 0 |
| (3) | 0 | 0 | 0 | 0 | 0 | 1 | 1 | 0 | (3) | 0 | 0 | 0 | 0 | 0 | 1 | 1 | 0 |
| (4) | 0 | 0 | 0 | 0 | 0 | 1 | 1 | 0 | (4) | 0 | 0 | 0 | 0 | 0 | 1 | 1 | 0 |

| Page buffer 224 | | | | | | | | | Bit line current detection | | | | | | | |
|---|---|---|---|---|---|---|---|---|---|---|---|---|---|---|---|---|
| | b0 | b1 | b2 | b3 | b4 | b5 | b6 | b7 | | b0 | b1 | b2 | b3 | b4 | b5 | b6 | b7 |
| (0) | 1 | 1 | 1 | 1 | 1 | 1 | 1 | 1 | (0) | – | – | – | – | – | – | – | – |
| (1) | 1 | 1 | 1 | 1 | 1 | 1 | 1 | 1 | (1) | – | – | – | – | – | – | – | – |
| (2) | 1 | 1 | 1 | 1 | 1 | 1 | 1 | 1 | (2) | H | L | L | H | L | H | H | L |
| (3) | 0 | 1 | 1 | 0 | 1 | 1 | 1 | 1 | (3) | – | – | – | – | – | – | – | – |
| (4) | 0 | 1 | 1 | 0 | 1 | 1 | 1 | 1 | (4) | – | – | – | – | – | – | – | – |

| Threshold voltage | | | | | | | | |
|---|---|---|---|---|---|---|---|---|
| | b0 | b1 | b2 | b3 | b4 | b5 | b6 | b7 |
| (0) | 1.4 | 2 | 2.5 | 1.5 | 3.1 | –1 | –2 | 3.6 |
| (1) | 1.4 | 2 | 2.5 | 1.5 | 3.1 | –1 | –2 | 3.6 |
| (2) | 1.4 | 2 | 2.5 | 1.5 | 3.1 | –1 | –2 | 3.6 |
| (3) | 1.4 | 2 | 2.5 | 1.5 | 3.1 | –1 | –2 | 3.6 |
| (4) | 2.4 | 2 | 2.5 | 2.5 | 3.1 | –1 | –2 | 3.6 |

FIG. 4

NON-VOLATILE MEMORY DEVICE AND ERROR COMPENSATION METHOD FOR VERIFYING THE SAME

CROSS-REFERENCE TO RELATED APPLICATION

This application claims the priority benefit of Taiwan application serial no. 106135728, filed on Oct. 18, 2017. The entirety of the above-mentioned patent application is hereby incorporated by reference herein and made a part of this specification.

BACKGROUND OF THE INVENTION

Field of the Invention

The disclosure relates to a non-volatile memory technique, and particularly relates to a non-volatile memory device and an error compensation method for verifying the same.

Description of Related Art

Along with quick development of science and technology, non-volatile memories are widely used in electronic devices. The non-volatile memory (for example, a flash memory, an electrically erasable programmable read-only memory (EEPROM)) may be used for accessing important information of the electronic device, and the stored information will not be lost due to power off.

The non-volatile memory may have a plurality of memory blocks, and the memory blocks may be composed of a plurality of memory cells (or referred to as memory units). During a process of programming the non-volatile memory, the memory cells in a same memory block are generally programmed together. However, due to defects of a manufacturing process or a physical characteristic, a wire connected to a source or a drain of the memory cell probably has noises due to parasitic capacitance/parasitic resistances. When the noises are excessively large, a valid determination voltage used for programming is decayed, even a value of the decayed valid determination voltage is greater than an originally reserved loss judge margin, which results in a fact that the memory block(s) cannot be correctly programmed.

Therefore, many manufacturers want to be able to determine whether these memory cells have been correctly programmed, and compensate the valid determination voltage for the memory cells that are not correctly programmed, so as to reduce the influence of the noises on the source lines of the memory cells.

SUMMARY OF THE INVENTION

The disclosure is directed to a non-volatile memory device and an error compensation method for verifying the same, which are adapted to detect and compensate an error appeared during an initial program process and a verification process of the non-volatile memory device caused by source terminal noises of memory cells.

The disclosure provides a non-volatile memory device. The non-volatile memory device includes a memory block, a word line driver, a bit line circuit and a controller. The memory block includes a plurality of memory cells, where control terminals of a part of the memory cells are connected to each other, and source electrodes of the part of the memory cells are connected to each other. The word line driver is used for providing a verification voltage to the memory cells. The bit line circuit is coupled to a bit line of the memory cells, and is used for reading the memory cells. After the word line driver and the bit line circuit perform a first programming process and a first verification process on the memory cells, the controller performs a reverse reading to the control terminals of the memory cells, respectively applies a preset voltage to the control terminals of the memory cells according to preset programming data by using the word line driver, reads data from the memory cells by using the bit line circuit, and determines whether the data of each of the memory cells is normal based on the data read from the memory cells. When the data of specific memory cells in the memory cells is not normal, the controller performs a second programming process to the specific memory cells.

The disclosure provides an error compensation method for verifying a non-volatile memory device. The non-volatile memory device includes a memory block including a plurality of memory cells, where control terminals of a part of the memory cells are connected to each other, and source electrodes of the part of the memory cells are connected to each other. The error compensation method includes following steps. After a first programming process and a first verification process are performed on the memory cells, a reverse reading is performed to the control terminals of the memory cells. A preset voltage is respectively applied to the control terminals of the memory cells according to preset programming data. Data is read from the memory cells, and it is determined whether the data of each of the memory cells is normal based on the data read from the memory cells. When data of specific memory cells is not normal, a second programming process is performed to the specific memory cells.

According to the above description, in the non-volatile memory device and the error compensation method for verifying the same, after a general programming process is performed to the memory block, the verification process of the disclosure is then performed thereto. The verification process is implemented through reverse reading, and normal reading of the data of the memory cells after the reverse reading to determine whether programming of the memory cells is completed (i.e., it is verified whether data in each of the memory cells is the same with the original preset programming data). If it is determined that programming of a part of the memory cells is not completed, the second programming process is then performed to the part of memory cells. Since programming of most of the memory cells is completed, noises are not produced at the source terminals of the memory cells, and during the second programming process, the noise influence on the programming incomplete memory cells is greatly decreased, so as to improve a success rate of the second programming process performed to the programming incomplete memory cells, and compensate the programming incomplete memory cells.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is an explanation example of providing a first buffer, a "bit line voltage/current detection" of each memory cell to the error compensation method of FIG. 2 and values of a "threshold voltage" of each of the memory cells.

DESCRIPTION OF EMBODIMENTS

Figure 1:
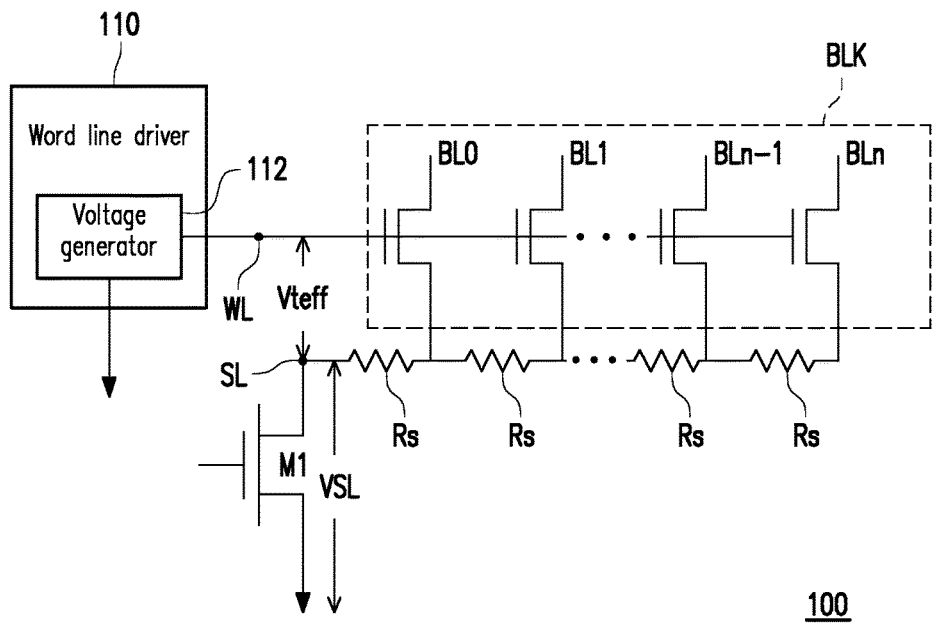
FIG. 1 is a schematic diagram of a non-volatile memory device.

FIG. 1 is a schematic diagram of a non-volatile memory device 100. As shown in FIG. 1, the non-volatile memory device 100 may include a word line driver 110, a memory block BLK and a source transistor M1. The memory block BLK has a plurality of memory cells, where control terminals of the memory cells are connected to each other to form a word line WL, and source electrodes of the memory cells are connected to each other to form a common source line SL. The drain electrodes of the memory cells are respectively connected to different bit lines (BL0 . . . BLn). The word line driver 110 may include a voltage generator 112. The voltage generator 112 may provide a programming pulse to the word line WL to program the memory cells during a programming process of the memory cells, and may provide a verification voltage VWL to the word line WL when a general verification process is performed to the memory cells.

When the non-volatile memory device 100 performs the programming process to the memory cells, the source transistor M1 is turned off, and the voltage generator 112 provides the programming pulse to the word line WL to program the memory cells. On the other hand, when the non-volatile memory device 100 completes programming the memory cells, and performs the general verification process to the memory cells, the source transistor M1 is turned on, and the voltage generator 112 provides the verification voltage VWL to the word line WL to verify whether the memory cells are correctly programmed. However, in case that the source transistor M1 is turned on, since the source terminals of the memory cells probably produce noises (for example, a source noise VSL) due to a parasitic capacitance/parasitic resistance (for example, a parasitic resistance Rs in a source line), the verification voltage VWL provided by the voltage generator 112 is equal to a sum of a valid judge voltage Vteff and the source noise VSL. Generally, the verification voltage VWL has a fixed value, so that the actual valid judge voltage Vteff exerted to the control terminal of each of the memory cells is decreased as the source noise VSL is produced. Moreover, as the verification process performed by the non-volatile memory device 100 after the general programming process cannot eliminate the influence of the source noise VSL, the verification process cannot get to know which memory cells that has an error due to the source terminal noises.

Therefore, the non-volatile memory device and the error compensation method thereof provided by the disclosure may obtain mask data through an external memory or other sources after the general programming process and verification process are performed the memory block, and then read each of the memory cells in the memory block to determine whether data of the memory cells is correct. Moreover, the non-volatile memory device of the present embodiment reads data from the memory cells that are required to be programmed and have been performed with a general programming process based on the aforementioned mask data, so as to determine whether programming of the memory cells is completed. If the data read from the memory cells is correct (i.e. the data read from the memory cells is the same with expected data after the programming), it represents that the memory cells are indeed programmed. Comparatively, if the data read from the memory cells is not correct (i.e. the data read from the memory cells is not the same with the expected data after the programming), the memory cells are required to be re-programmed. In such phase, since most of the memory cells have been programmed, and the programmed memory cells do not produce the noises at the source lines thereof, when the second programming process is performed, the noise influence on the programming incomplete memory cells is greatly decreased, so that a success rate of the second programming process performed to the programming incomplete memory cells is enhanced, and the programming incomplete memory cells are compensated.

Figure 2:
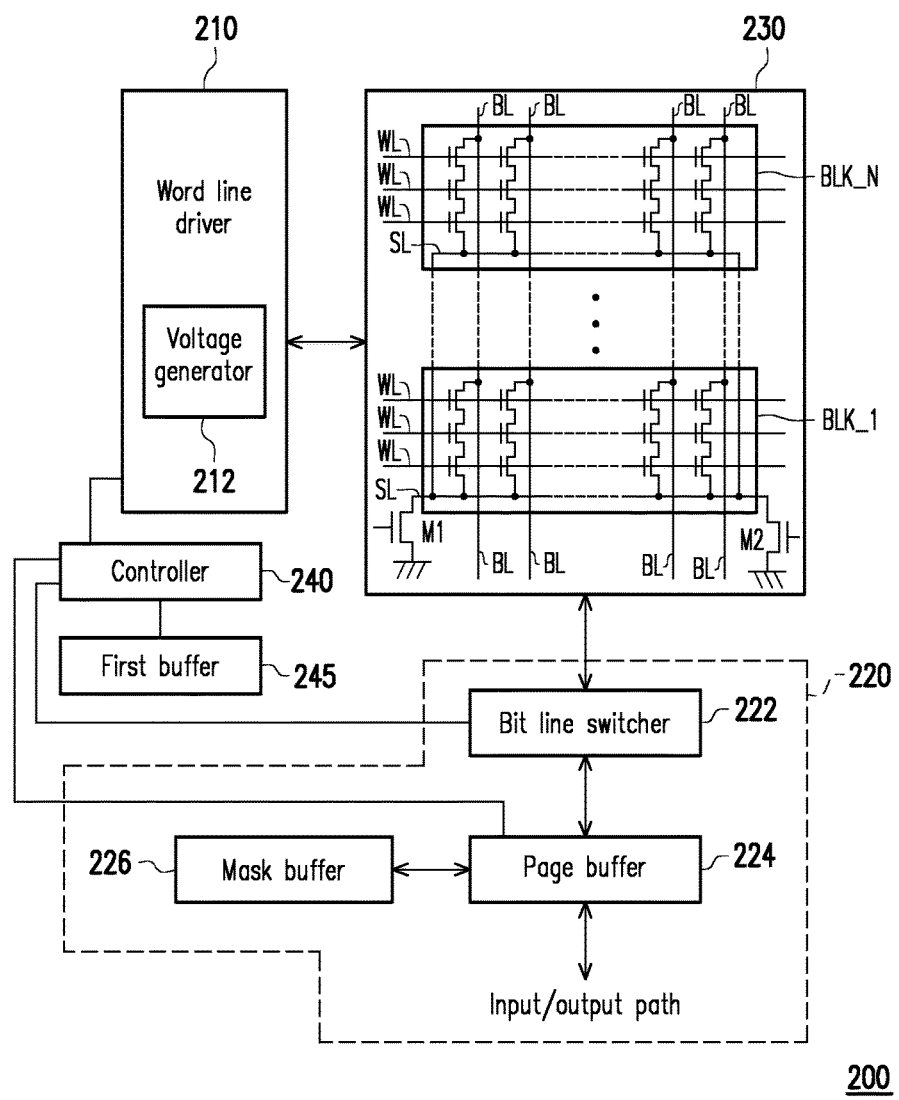
FIG. 2 is a block diagram of a non-volatile memory device according to an embodiment of the disclosure.

FIG. 2 is a block diagram of a non-volatile memory device 200 according to an embodiment of the disclosure. The non-volatile memory device 200 includes a word line driver 210, a bit line circuit 220, a memory array 230 and a controller 240. The word line driver 210 includes a voltage generator 212 used for generating a programming pulse and a verification voltage. The memory array 230 includes a plurality of memory blocks BLN_1-BLK_N. The memory cells of each of the memory blocks BLN_1-BLK_N share the source transistors (for example, transistors M1 and M2). One end of each of the source transistors M1, M2 is coupled to ground, and another end of each of the source transistors M1, M2 is connected to a common source line of each of the memory blocks BLN_1-BLK_N, so as to uniformly control the source voltages of the memory cells. The memory cells in a row of each of the memory blocks BLN_1-BLKN have a specific number, for example, 8 memory cells are in a same row, such that data of 8 bits (i.e. one byte) is access each time from 8 memory cells. The control terminals of the memory cells of the same row are coupled to the same word line WL, and the memory cells in the same row respectively have different bit lines BL. The source electrodes of the memory cells in the same row are connected to each other to form a source line SL.

The bit line circuit 220 may include a bit line switcher 222, a page buffer 224, a mask buffer 226 and an input/output path of data. The bit line circuit 220 may detect a current value or a voltage value of each of the memory cells in each row by using a sensor in the page buffer 224, so as to detect and determine related values of each memory cell. In the present embodiment, the non-volatile memory device 200 may further include a first buffer 245, which is used for temporarily storing preset data or related information. Those skilled in the art may allocate the first buffer 245 to external or internal of the controller 240, or allocate the same in other devices of the bit line circuit 220 (for example, the bit line switcher 222, the page buffer 224, the word line driver 210), and an allocation position of the first buffer 245 is not limited by the disclosure, and the spirit of the disclosure is met as long as the controller 240 may access the first buffer 245. The mask buffer 226 is used for recording the memory cells that are not required to be programmed, so that it may be a volatile memory, or a read-only memory, which is determined according to an actual requirement of a user.

Moreover, the first buffer 245 may also be omitted in a part of the embodiments of the disclosure.

The controller 240 is mainly used for implementing the error compensation method of the disclosure. Those skilled in the art may implement the controller by a complex programmable logic device (CPLD), a field programmable gate array (FPGA) or a system chip according to an actual requirement, and may also integrate the function of the controller 240 to the word line driver 210 or the bit line circuit 220.

Figure 3:
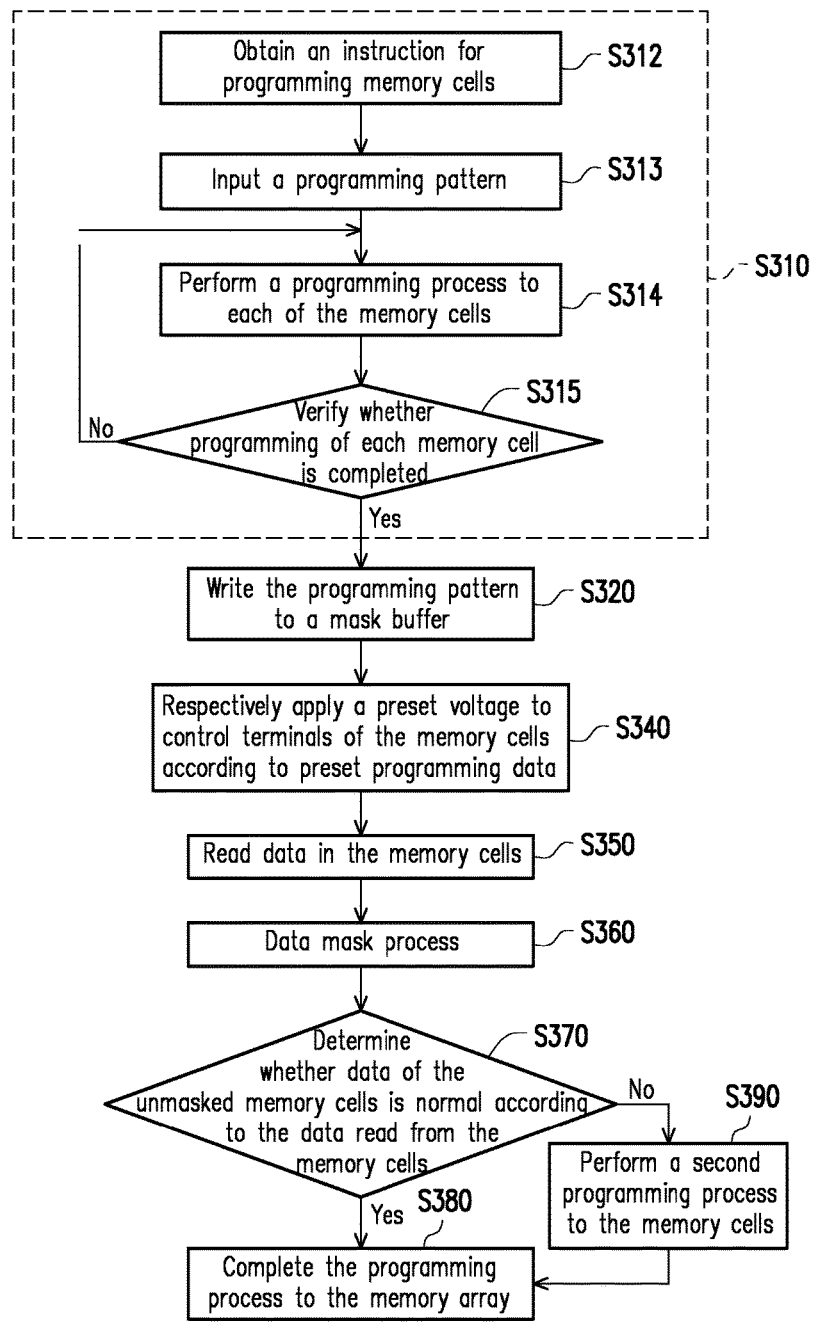
FIG. 3 is a flowchart illustrating an error compensation method for programming the non-volatile memory device 200 according to an embodiment of the disclosure.

FIG. 3 is a flowchart illustrating an error compensation method for programming the non-volatile memory device 200 according to an embodiment of the disclosure. FIG. 4 is a first explanation example of providing the first buffer 245, the mask buffer 226, the page buffer 224, a "bit line voltage/current detection" of each memory cell to the error compensation method in FIG. 2 and values of a "threshold voltage" of each of the memory cells.

The error compensation method of FIG. 3 is adapted to the non-volatile memory device 200 of FIG. 2. Referring to FIG. 2 and FIG. 3, in step S310, the controller 240 performs a first programming process (step S312 to step S314) and a verification process (step S315) to each of the memory cells in the memory block by using the word line driver 210 and the bit line circuit 220.

In detail, in step S312, the controller 240 obtains an instruction of programming all of the memory cells in the memory array, and in the step S313, the programming pattern is input to the first buffer 245 of the controller 240 to know the memory cells required to be programmed. In the step S314, the voltage generator 212 of the word line driver 212 generates a preset voltage to the control terminals (i.e. the word line WL) of the memory cells, and determines the memory cells to required to be programmed according to the programming pattern in the first buffer 245 of the controller 240, i.e. to exert a programming pulse to the word line WL of each of the memory cells. Then, in the step S315, the controller 240 verifies whether programming of the memory cells is completed through the word line driver 210, the bit line switcher 222 and the page buffer 224.

However, the programming verification process of the above step S315 may still be interfered by the noises of the memory cells, so that in the error compensation method of the present embodiment of the disclosure, after the general programming process and the verification process (i.e. the step S310) are performed to the memory block, a specific verification process of the embodiment of the disclosure is further performed, which is described in detail below. Moreover, a field (0) of the first buffer 245 and the mask buffer 226 is "-", which represents "don't care" in logic, i.e. an initial logic value is not important and does not influence a function. The field (0) of the page buffer 224 is a result stored after the step S310 is completed, i.e. the expected data is all logic "1".

It is assumed that the non-volatile memory device 200 is about to program each of the memory cells to logic "1", it is expected that the threshold voltage of each of the memory cells is increased to be more than 1.8V. The memory cells b0-b7 of 8 bits are taken as an example for description, and fields (0), (1), (2), (3) and (4) respectively correspond to the steps of FIG. 3. The field (0) in FIG. 4 represents values of the memory cells b0-b7 in each device after execution of the step S310 (i.e. the first programming process) of FIG. 3 is completed; the field (1) in FIG. 4 represents values of the memory cells b0-b7 in each device after execution of the step S320 of FIG. 3 is completed; the field (2) in FIG. 4 represents values of the memory cells b0-b7 in each device after execution of the step S340 of FIG. 3 is completed; the field (3) in FIG. 4 represents values of the memory cells b0-b7 in each device after execution of the step S350 and the step S360 of FIG. 3 is completed; and the field (4) in FIG. 4 represents values of the memory cells b0-b7 in each device after execution of the step S390 of FIG. 3 is completed. The first buffer 245 and the mask buffer 226 of the present embodiment do not have the preset value in an initial stage, and as shown in FIG. 4, the fields (0) of the first buffer 245 and the mask buffer 226 are all filled with "-", i.e. the preset value in the initial state is unknown.

In the present embodiment, the "bit line current detection" of FIG. 4 lists the voltages exerted to the control terminals of each of the memory cells in the field (2) (i.e. the step S340), and a reading result obtained from the step S350. In the present embodiment, the "bit line current detection" technique is adopted to obtain data of each of the memory cells, and those skilled in the art may also use a "bit line voltage detection" technique to obtain the data of each of the memory cells. The symbol "-" in the "bit line current detection" represents that it is still not start to detect the current value of each of the memory cells; a symbol "L" represents that a current value lower than a preset current value is detected in the bit line; and a symbol "H" represents that a current value higher than the preset current value is detected in the bit line. The "threshold voltage" of the straight column in FIG. 4 represents actual values of the threshold voltages of each of the memory cells b0-b7 under different situations.

In the present embodiment, a preset threshold voltage value is, for example, 1.8V, namely, when a threshold voltage of a memory cell is higher than 1.8V, it represents that the memory cell has been correctly programmed to the value "1", and when the threshold voltage of the memory cell is lower than 1.8V, it represents that the memory cell is not correctly programmed to the value "1". It is assumed that after the general first programming process (the step S310) is performed, the threshold voltage values of each of the memory cells b0-b7 are shown in the field (0) of the "threshold voltage", and the memory cells b0 and b3 are actually not programmed correctly since the threshold voltage 1.4V of the memory cell b0 and the threshold voltage 1.5V of the memory cell b3 are all lower than the preset threshold voltage value 1.8V, though the result of the step S310 cannot be learned through the general verification process. The memory cells b5 and b6 are not required to be programmed, so that the values thereof in the "threshold voltage" are ignored.

Referring back to FIG. 3, in step S320, the controller 240 may write the programming pattern from the first buffer 245 to the mask buffer 226. In other words, the controller 240 may store the programming pattern into the first buffer 245 in advance before the step S320. The "programming pattern" of the present embodiment may be used for recording the memory cells that are not required to be programmed, for example, the memory cells b5, b6 of FIG. 4 are not required to be programmed. The programming pattern of the present embodiment is "0000 0110". In the subsequent steps, the controller 240 uses the information recorded by the mask buffer to avoid exerting the preset voltage to the memory cells b5, b6 that are not required to be programmed. It should be noted that if all of the memory cells are required to be programmed, usage of the mask buffer 226 is selective. Particularly, the step S320 is only to load the programming pattern from the first buffer 245 to the mask buffer 226 without performing other operations, and the data in the mask buffer 226 is used in subsequent steps only when a data mask process (step S360), a verification process (step S370) and/or a second programming process (step S390) are required to be performed to the memory cells.

In the step S340, the controller 240 respectively exerts the preset voltage to the control terminals of each of the memory cells according to preset programming data by using the voltage generator 212 in the word line driver 210. In the present embodiment, the memory cells having a higher current ("H") in the bit line BL are regarded as logic "1", and the memory cells having a lower current ("L") in the bit line BL are regarded as logic "0". The "preset voltage" is set relative to the preset programming data, and the preset programming data of the present embodiment is logic "0" (i.e. it is expected that the data in each of the memory cells is logic "0"), and the controller 240 takes the preset threshold voltage value 1.8V as the "preset voltage" and exerts the same to the control terminals of each of the memory cells. Therefore, after the step S340, in the step S350, the controller 240 may read the data of each of the memory cells in the bit line by using the bit line circuit 220. The bit line current detection of each of the memory cells is shown as the field (2) of the "bit line current detection" of FIG. 4. In detail, when each of the memory cells b0-b7 is correctly programmed (i.e. the threshold voltage of the memory cell actually reaches 1.8V or more), the bit lines corresponding to the memory cells (for example, b1-b2, b4, b7) detected by the bit line switcher 222 should have the lower current ("L") since the memory cells are still in a turn off state. Comparatively, when each of the memory cells b0-b7 is not correctly programmed (i.e. the threshold voltage of the memory cell is actually not higher than 1.8V), the bit lines corresponding to the memory cells (for example, b0, b3) detected by the bit line switcher 222 should have the higher current ("H"), since the memory cells are changed from the turn off state of the step S320 to a turn on state. Since in the step S340, the preset threshold voltage value (1.8V) is exerted to the control terminals of the memory cells, and the threshold voltages (which are respectively 1.4V and 1.5V) of the memory cells b0, b3 are all lower than the preset threshold voltage value (1.8V), the values of the memory cells b0, b3 in the field (3) of the page buffer 224 are adjusted from the original logic "1" (i.e. the memory cells are in the turn off state) to the value "0" (i.e. the memory cells are in the turn on state). In this way, whether the data of the memory cell is normal may be learned from the data adjustment performed in the page buffer 224.

In step S360, the controller 240 masks a part of the memory cells (for example, the memory cells b5, b6) to perform a data mask process according to the data (i.e. the programming pattern) in the mask buffer 226. In step S370, the controller 240 determines whether data of the unmasked memory cells b0-b4, b7 (i.e. memory cells that are not subjected to the data mask process) is normal according to the data in the bit line obtained through the step S350. The controller 240 may learn whether the data of the memory cells b0-b4, b7 is normal according to the data recorded by the page buffer 224. Namely, the page buffer 224 may be used for recording a position of an abnormal specific memory cell. Moreover, the controller 240 does not determine the normality of the data of the masked memory cells.

In the present embodiment, the so-called "whether the data is normal" refers to that when the corresponding symbol of the memory cells b0-b4, b7 in the field (2) of the "bit line current detection" of FIG. 4 is "L", it represents that the memory cell is normally programmed, and when the corresponding symbol is "H", it represents that the memory cell has an error (abnormal) during the programming process. In the present embodiment, a bit line current detecting result of the step S340 is stored in the page buffer 224 after the data mask process of the programming pattern of the mask buffer 226. A rule of the "data mask process" is that if the bits b0-b7 corresponding to the specific memory cells in the mask buffer are logic "0", the bit line current detecting result of the step S340 (for example, "L" is regarded as logic "0"; and "H" is regarded as logic "1") is reversed and written to the corresponding position of the page buffer 224. Comparatively, if the bits b0-b7 corresponding to the specific memory cells in the mask buffer are logic "1", regardless of the detecting result of the step S340, the corresponding position of the page buffer 224 is written with logic "1". For example, since the bit line current detecting result of the memory cells b0, b3 in the step S340 is "H", the positions of the page buffer 224 corresponding to the memory cells b0, b3 in the field (3) are written with logic "0"; and since the bit line current detecting result of the memory cells b1-b2, b4, b7 in the step S340 is "L", the positions of the page buffer 224 corresponding to the memory cells b1-b2, b4, b7 in the field (3) are written with logic "1".

When all of the memory cells are determined to be normal in the step S370, the controller 240 enters a step S380 to complete the programming process to the memory array 230. Comparatively, when data of specific memory cells is abnormal (for example, in the field (2) of the "bit line current detection" and the field (3) of the "page buffer 224" of FIG. 4, it is all indicated that the memory cells b0, b3 are abnormal), a step 390 is executed, and the controller 240 performs the second programming process to the corresponding memory cells b0, b3 based on the data and symbols stored in the page buffer 224.

The second programming process (the step S390) is performed in allusion to the specific memory cells other than all of the memory cells since programming of most of the memory cells has been completed, and the programming completed memory cells do not produce the noises on the source lines thereof. Therefore, the source terminal noises of the memory cells are greatly decreased, such that the wrongly programmed specific memory cells may be correctly programmed now, so as to compensate the programming error of the memory cells occurred due to the source terminal noises. The related operation flow of the "second programming process" of the disclosure may be implemented according to the step S312 to the step S314 in FIG. 3, or a voltage value of the programming pulse exerted to the word line WL by the voltage generator 212 of FIG. 2 may be slightly adjusted according to an actual requirement, so as to easily program the memory cells. The field (4) of the "threshold voltage" of FIG. 4 lists the results of re-verification of the memory cells after the second programming process. For example, according to the field (4) of the "threshold voltage" of FIG. 4, it is known that the threshold voltage of the memory cell b0 is changed to 2.4V from the original 1.4V after the second programming process, and the threshold voltage of the memory cell b3 is changed to 2.5V from the original 1.5V after the second programming process, which are all complied with the programming standard of the memory cells. In this way, after the step S390 is completed, the step S380 is executed to complete programming the memory cells of the memory array 230.

In a part of the embodiments of the disclosure, the original programming pattern may also be obtained from other sources, and the disclosure is not limited to obtain the original programming pattern from the first buffer 245. For example, in the present embodiment, a 0V verification voltage may be applied to the memory cells for reading data, and the read data is reversed and written into the mask buffer 226. Therefore, the present embodiment may also adopt "an inverse result of the data read from the memory cells" to serve as the original programming pattern. In this way, the embodiment of the disclosure may also be implemented without using the data of the first buffer 245 shown in FIG. 4.

In summary, in the non-volatile memory device and the error compensation method for verifying the same, after a general programming process is performed to the memory block, the verification process of the disclosure is then performed thereto. The verification process is implemented through reverse reading, and normal reading of the data of the memory cells after the reverse reading to determine whether programming of the memory cells is completed (i.e., it is verified whether data in each of the memory cells is the same with the original preset programming data). If it is determined that programming of a part of the memory cells is not completed, the second programming process is then performed to the part of memory cells. Since programming of most of the memory cells is completed, noises are not produced at the source terminals of the memory cells, and during the second programming process, the noise influence on the programming incomplete memory cells is greatly decreased, so as to improve a success rate of the second programming process performed to the programming incomplete memory cells, and compensate the programming incomplete memory cells.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory device, comprising:
a memory block, having a plurality of memory cells, wherein control terminals of a part of the memory cells are connected to each other, and source electrodes of the part of the memory cells are connected to each other;
a word line driver, providing a verification voltage to the memory cells;
a bit line circuit, coupled to a bit line of the memory cells, and configured to read the memory cells; and
a controller, wherein after the word line driver and the bit line circuit perform a first programming process and a first verification process on the memory cells, the controller respectively applies a preset voltage to the control terminals of the memory cells according to a programming pattern by using the word line driver, reads data from the memory cells by using the bit line circuit, and determines whether the data of each of the memory cells is normal based on the data read from the memory cells, and
when the data of specific memory cells in the memory cells is not normal, the controller performs a second programming process to the specific memory cells.

2. The non-volatile memory device as claimed in claim 1, further comprising:
a first buffer, configured to record the programming pattern.

3. The non-volatile memory device as claimed in claim 1, wherein the bit line circuit comprises a mask buffer configured to record masked memory cells not requiring a programming process,
wherein the controller does not determine normality of data of the masked memory cells.

4. The non-volatile memory device as claimed in claim 1, wherein when data of the memory cells is normal, the controller completes a programming process on the memory block.

5. The non-volatile memory device as claimed in claim 1, wherein the bit line circuit comprises a page buffer configured to record positions of the specific memory cells.

6. An error compensation method for verifying a non-volatile memory device, wherein the non-volatile memory device comprises a memory block comprising a plurality of memory cells, control terminals of a part of the memory cells are connected to each other, and source electrodes of the part of the memory cells are connected to each other, the error compensation method comprising:
after a first programming process and a first verification process are performed on the memory cells, respectively applying a preset voltage to the control terminals of the memory cells according to a programming pattern;
reading data from the memory cells;
determining whether the data of each of the memory cells is normal or not based on the data read from the memory cells; and
when data of specific memory cells is not normal, performing a second programming process to the specific memory cells.

7. The error compensation method for verifying the non-volatile memory device as claimed in claim 6, further comprising:
recording the programming pattern through a first buffer.

8. The error compensation method for verifying the non-volatile memory device as claimed in claim 6, further comprising:
recording positions of the specific memory cells through a page buffer.

9. The error compensation method for verifying the non-volatile memory device as claimed in claim 6, further comprising:
recording masked memory cells not requiring a programming process through a mask buffer; and
not determining normality of data of the masked memory cells.

10. The error compensation method for verifying the non-volatile memory device as claimed in claim 6, further comprising:
when data of the memory cells is normal, completing a programming process on the memory block.

* * * * *